(12) United States Patent
Lin et al.

(10) Patent No.: US 9,953,581 B2
(45) Date of Patent: Apr. 24, 2018

(54) PULSE WIDTH MODULATION (PWM) DRIVING SCHEME AND BEZEL REDUCTION

(71) Applicant: Apple Inc., Cupertino, CA (US)

(72) Inventors: Hung Sheng Lin, San Jose, CA (US); Chin-Wei Lin, Cupertino, CA (US); Tsung-Ting Tsai, Cupertino, CA (US); Sang Y. Youn, Cupertino, CA (US); Hyunwoo Nho, Stanford, CA (US)

(73) Assignee: Apple Inc., Cupertino, CA (US)

( * ) Notice: Subject to any disclaimer, the term of this patent is extended or adjusted under 35 U.S.C. 154(b) by 309 days.

(21) Appl. No.: 14/988,594

(22) Filed: Jan. 5, 2016

(65) Prior Publication Data

US 2016/0247456 A1 Aug. 25, 2016

Related U.S. Application Data

(60) Provisional application No. 62/119,086, filed on Feb. 20, 2015.

(51) Int. Cl.
*G09G 3/32* (2016.01)
*G09G 3/3266* (2016.01)
*G09G 3/20* (2006.01)
*G11C 19/00* (2006.01)

(52) U.S. Cl.
CPC ......... *G09G 3/3266* (2013.01); *G09G 3/2022* (2013.01); *G09G 3/2092* (2013.01); *G09G 2300/0408* (2013.01); *G09G 2310/0286* (2013.01); *G11C 19/00* (2013.01)

(58) Field of Classification Search
CPC ... G09G 2300/0408; G09G 2310/0286; G09G 3/2022; G09G 3/2092; G11C 19/00
See application file for complete search history.

(56) References Cited

U.S. PATENT DOCUMENTS

| 6,281,822 | B1 | 8/2001 | Park | |
|---|---|---|---|---|
| 8,482,698 | B2 | 7/2013 | Atkins | |
| 8,907,884 | B2 | 12/2014 | Thompson et al. | |
| 2005/0253791 | A1* | 11/2005 | Shin | G09G 3/3266 345/76 |
| 2006/0044230 | A1* | 3/2006 | Eom | G09G 3/3233 345/76 |
| 2008/0186261 | A1* | 8/2008 | Lee | G09G 3/3225 345/82 |
| 2015/0015554 | A1* | 1/2015 | Kim | G09G 3/3208 345/208 |

* cited by examiner

Primary Examiner — Latanya Bibbins
(74) Attorney, Agent, or Firm — McDermott Will & Emery LLP (57) ABSTRACT

This application sets forth a circuit configuration for a light emitting diode (LED) or organic light emitting diode (OLED) display. The circuit configuration allows for the pulse-width modulation (PWM) of each emission signal sent to each line of the display. The PWM of each emission signal is accomplished using a gate-in-panel (GIP) controller of the display. The GIP controller uses an arrangement of shift register outputs and a programmable clock input to control an output of an inverter that provides the emission signal. The programmable clock input can be programmed according to a desired timing or duty cycle for the emission signal. In this way, by limiting the duty cycle of the emission signal, dimming and other display features can be exhibited by the LED or OLED display.

20 Claims, 11 Drawing Sheets

| | TYPE 1 | TYPE 2 | PROPOSED |
|---|---|---|---|
| PWM | X | X | ✓ |
| #GIP | 4 | 2 | 4 |
| #GCLK | 19 | 12 | 9 |
| TESTABILITY | NON-COMP DC/AC | NON-COMP AC | NON-COMP DC/AC |
| BEZEL | REFERENCE | -150um | -100um |

*FIG. 11*

PULSE WIDTH MODULATION (PWM) DRIVING SCHEME AND BEZEL REDUCTION

CROSS-REFERENCE TO RELATED APPLICATION

The present application claims the benefit of U.S. Provisional Application No. 62/119,086, entitled "PULSE WIDTH MODULATION (PWM) DRIVING SCHEME AND BEZEL REDUCTION," filed Feb. 20, 2015, the content of which is incorporated herein by reference in its entirety for all purposes.

FIELD

The described embodiments relate generally to clocking schemes for a display device. Specifically, the embodiments relate to a gate-in-panel (GIP) controller that enables pulse width modulation (PWM) and provides a more efficient use of circuit board space.

BACKGROUND

Recent advances in display technology have enabled display manufacturers to produce high resolution displays. However, such high resolution displays can be difficult to control using current circuitry. For example, given the number of lines for certain high resolution displays, providing a suitable number of signals to operate each line can prove daunting in view of size limitations for many displays.

SUMMARY

This paper describes various embodiments that relate to systems, methods, and apparatus for performing pulse-width modulation of an emission output for a line of a computer display. In some embodiments, a computer-implemented method is set forth. The computer-implemented method provides for using a programmable clock input to a gate-in-panel (GIP) controller to perform pulse-width modulation (PWM) of an output signal for a line of a display. The computer-implemented method can include a step of receiving a scanning signal from at least one shift register of the GIP controller. The computer-implemented method can further include the steps of receiving a programmed output from the at least one shift register, wherein the programmed output is based on the programmed clock input to the GIP controller. Additionally, the computer-implemented method can include a step of causing a pulse-width of the output signal to be adjusted according to a high or low state of each of the scanning signal and the programmed output.

In other embodiments, a system is set forth. The system can include a gate-in-panel (GIP) controller, and an integrated circuit (IC) driver. The IC driver can be configured to provide a programmable clock input to the GIP controller. The system can further include at least one display line connected to the GIP controller. The GIP controller can include i) at least one shift register configured to provide at least one scanning signal to the at least one display line, and ii) an inverter. The inverter can be connected to the at least one shift register. The inverter can be configured to output a pulse-width modulated (PWM) emission signal based on the programmable clock input provided to the at least one shift register and the at least one scanning signal.

In yet other embodiments, a gate-in-panel controller is set forth. The GIP controller can include a shift register configured to provide multiple scanning signals and a programmable clock output. The programmable clock output can be based on at least one clock input from an integrated circuit (IC) driver. The GIP controller can further include an inverter connected to i) a scanning signal of the multiple scanning signals and ii) the programmable clock output of the shift register. In this way, the inverter can be configured to provide a pulse-width modulated (PWM) emission signal to a line of a display based on a timing of the programmable clock output and the scanning signal.

Other aspects and advantages of the invention will become apparent from the following detailed description taken in conjunction with the accompanying drawings which illustrate, by way of example, the principles of the described embodiments.

BRIEF DESCRIPTION OF THE DRAWINGS

The disclosure will be readily understood by the following detailed description in conjunction with the accompanying drawings, wherein like reference numerals designate like structural elements.

DETAILED DESCRIPTION

Representative applications of methods and apparatus according to the present application are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

The embodiments set forth herein relate to systems, methods, and apparatus for controlling a display of a computer. A display can include a pixel array having multiple lines that are activated or deactivated depending on the content of a data frame provided to the pixel array. As each data frame is processed, each pixel of the pixel array can be toggled on for a certain duration or be left off according to the content of the data frame. Unfortunately, for many display devices, the duration of time that a pixel is on can be a fixed period of time, and as a result, certain features, such as dimming, cannot be exhibited by such displays. In contrast, by adjusting the duration of individual pulses provided to a pixel during the processing of multiple data frames, a dimming effect can be realized by the display. Such adjustment to the duration of individual pulses can be performed using pulse-width modulation (PWM). However, by providing for PWM in some displays, the arrangement of display circuitry can consume more space than desired.

The embodiments set forth herein resolve the aforementioned issues by providing a more efficient routing of signals within the display while also providing PWM capabilities. Specifically, the embodiments set forth herein provide an optimized arrangement of clock signals that allows for both a reduced bezel size of a display and pulse-width modulation (PWM) of an emission (EM) signal. The EM signal is responsible for turning on light emitting diodes (LEDs) and/or organic light emitting diodes (OLEDs), and by performing PWM of the EM signal, dimming can be realized at each LED/OLED. The clock signals are coordinated by a gate-in-panel (GIP) controller that includes one or more shift registers and one or more inverters. A GIP controller can be connected to one or more lines of a display. The GIP controller can operate a line according to a programmable clock output (GCLK) received from an integrated circuit (IC) driver of the display and one or more shift register outputs from an adjacent line. By using the GCLK in combination with one or more shift register outputs and an inverter output, the PWM of the EM signal can be realized, as further discussed herein.

For a given line, the shift register can be provided at least a first scanning signal and a second scanning signal. The first scanning signal is used to determine an on time for a line, and the second scanning signal can be provided from a portion of the shift register associated with an adjacent line. The first scanning signal and the second scanning signal can determine a duration of time within a line refresh period that each LED or OLED of a line can be turned on. The shift register can also provide one or more outputs to one or more inverters connected to the shift register. Each inverter can receive, from the shift register, a programmed output based on a programmable clock signal received by the shift register from the IC driver. Additionally, the inverter can receive one or more scanning outputs provided by one or more shift register outputs associated with an adjacent line. The output of the inverter can be the EM signal responsible for turning on the LEDs/OLEDs. The inverter can be configured such that a duty cycle or a pulse width of the EM signal is depends upon one or more scanning outputs and a time delay or time shift of the programmable clock signal from the IC driver. For example, when a scanning output to an inverter is high, the EM signal will be low, thereby allowing for the EM signal to remain off. The EM signal will remain off until the programmable clock signal is high and the scanning output is low. In this way, the amount of time that the EM signal is off can be set according to the arrangement of the IC driver, the GIP controller, and/or the shift register, thereby allowing for PWM of the EM signal.

In other embodiments, for a given line, the shift register can receive i) the programmable clock signal from the IC driver and ii) at least two phases of a scanning signal from a shift register output corresponding to an adjacent line. In order to refresh a line of a pixel array, a first scanning signal and a second scanning signal are used to define a refresh period. The first scanning signal is a backward phase-shifted version (N−1) of the scanning signal (N) and the second scanning signal is a forward phase-shifted version (N+1) of the scanning signal. The beginning of the refresh period is defined by a pulse of the first scanning signal (N−1) and the end of the refresh period can be defined by a pulse of the second scanning signal (N+1). During the refresh period, one or more of the scanning signals in combination with the programmable clock signal are used to determine when and how long to turn on the EM signal. One or more of the scanning signals (e.g., (N−1), (N+1), and/or (N)) and the programmable clock signal are provided to an inverter that is connected to the shift register and outputs the EM signal. As long as the one or more of the scanning signals provided to the inverter remain low, the programmable clock signal can be programmed to pulse at any time between a pulse of the first scanning signal and a pulse of the second signal to initiate a pulse of the EM signal. The pulse width of the EM signal during a refresh period can vary with a delay of the pulse of the programmable clock signal. For example, as a delay in the pulse of the programmable clock signal is extended, the pulse width of the EM signal during a refresh period becomes smaller. Additionally, as a delay in the pulse of the programmable clock signal is shortened, the pulse width of the EM signal during a refresh period becomes larger. The temporal relationship between the programmable clock signal and the pulse width of the EM signal provides for the PWM of the EM signal. This can be useful when dimming a display, such as a light emitting diode (LED) display and organic LED (OLED) display. Additionally, by arranging the various clock signals and scanning signals according to the embodiments discussed herein, bezel and signal routing area can be reduced. This in part results from the reduction in the number of cock signals that are routed to the shift register.

These and other embodiments are discussed below with reference to FIGS. 1-11; however, those skilled in the art will readily appreciate that the detailed description given herein with respect to these figures is for explanatory purposes only and should not be construed as limiting.

Figure 1:
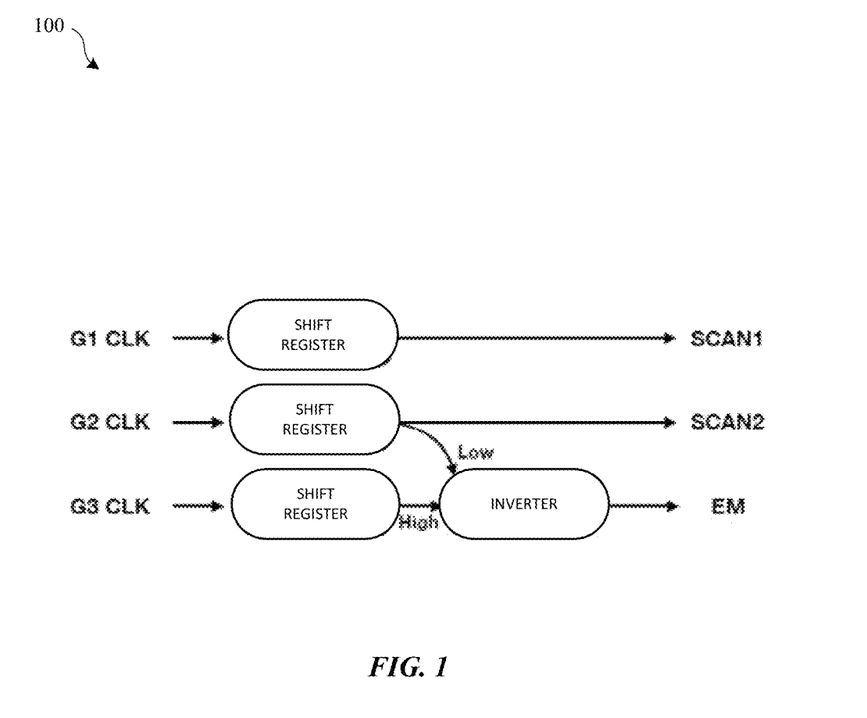
FIG. 1 illustrates a gate-in-panel (GIP) system that enables the (pulse-width modulation) PWM of an emission (EM) signal.

FIG. 1 illustrates a GIP system 100 that enables the PWM of the EM signal. The GIP system 100 can be connected to an IC driver that provides a clock signal and data voltage for each line. Additionally, the GIP system 100 can be connected to one or more lines of a display in order to effectively refresh each line. For example, "SCAN1" can control a switch that provides for gate voltage programming, and "SCAN2" can be a separate control signal that controls a switch that initializes a pixel. The clocks G1 CLK, G2

CLK, and G3 CLK can refer to multiple clocks derived from a clock output of the IC driver. For example, one or more of the G1 CLK, G2 CLK, and/or G3 CLK can be a phase-shifted version of the clock output from the IC driver. Additionally, the G3 CLK can be shifted or delayed according to a setting of the IC driver, GIP system 100, and/or shift register in order to perform PWM of the EM signal. The EM signal is provided by an output of an inverter and is controlled based on the G2 CLK and the G3 CLK. The G3 CLK can be a programmable clock output of the IC driver, which can control the on time or duty cycle of the EM signal thereby allowing for PWM of the EM signal. In some embodiments, during an on time or emission period of the EM signal, the SCAN1 shift register is not dependent upon the SCAN2 shift register in order to prevent loss of a gate setting.

The inverter can provide a single EM signal output without providing another output to an adjacent line. The inverter can be connected to one or more phases of the "SCAN2" signal in order to allow for PWM of the EM signal. The SCAN2 signal refers one or more outputs of a portion of the shift register that receives the G2 CLK signal. The inverter can be connected to a portion of the shift register that is provided the G3 CLK signal and a single phase of the SCAN2 signal (e.g., SCAN 2 (N+1)) as illustrated in FIG. 1. In other embodiments, the inverter can be connected to two phases of the SCAN 2 signal (e.g., SCAN2 (N−1) and (N+1)) and the portion of the shift register that is provided the G3 CLK. In this way, the inverter can be arranged such that the EM signal will be on or high when i) one or more phases of the SCAN2 signal are off or low and ii) the portion of the shift register connected to the G3 CLK is providing an on or high signal. As a result, by delaying the G3 CLK during a refresh period, the pulse width of the EM signal can effectively be increased or reduced according to how long the G3 CLK is programmed to be delayed. In some embodiments, the shift register can operate according to a two-phase, three-phase, four-phase, or any other suitable phase clock or scanning signal.

Figure 2:
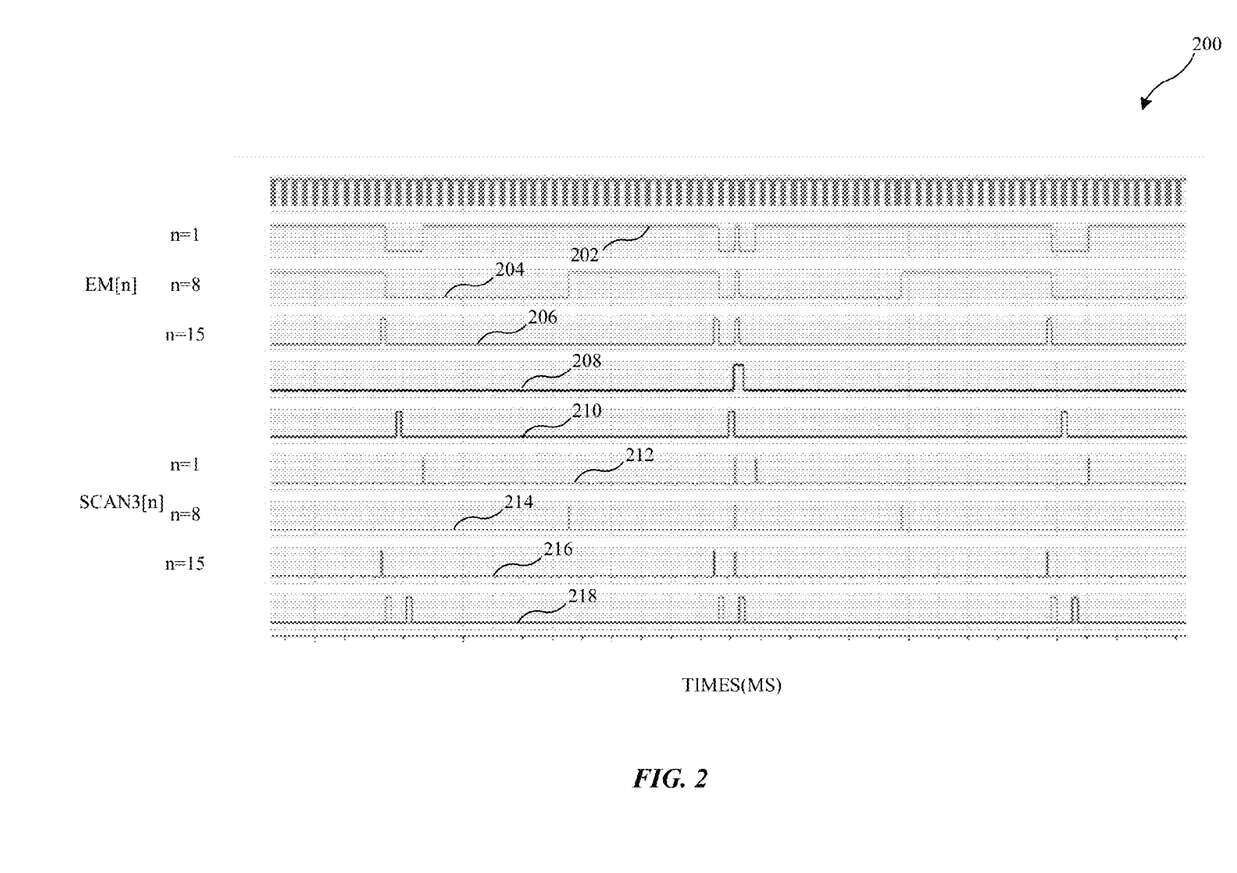
FIG. 2 illustrates a plot of various signals used in order to effectively perform PWM of the EM signal.

FIG. 2 illustrates a plot 200 of various signals used in order to effectively perform PWM of the EM signal. Specifically, FIG. 2 illustrates different variations in pulse width of the EM signal that can be provided by the embodiments discussed herein. For example, "SCAN3[$n$]" can represent the output of the portion of the shift register connected to the G3 CLK signal discussed herein. Additionally, each of the SCAN3 signals 212, 214, and 216 can represent different outputs that are programmed to provide variations in pulse width for each of the EM signals 202, 204, and 206. Furthermore, one or more phases of the SCAN2 signal are illustrated as signals 210 and 218, and SCAN1 is illustrated as signal 208. As set forth in FIG. 2, the on time or high time of the EM signals 202, 204, and 206 is dependent upon when a pulse of the SCAN3 signals 212, 214, and 216 are output. The EM signal 202 has the widest pulse of the EM signals 202, 204, and 206 because the a pulse of the SCAN3 signal 212 is provided the earliest compared to pulses of the SCAN3 signals 214 and 216. Additionally, the pulse of the SCAN3 signal 212 is closer in time to a pulse of the SCAN2 signal 210 than pulses of the other SCAN3 signals 214 and 216, thereby causing a pulse width of the EM signal 202 to be wider than the pulse widths of the EM signals 204 and 206. In this way, because a shift or delay of G3 CLK signal is programmable, PWM of the EM signals 202, 204, and 206 is possible.

Figure 3A:
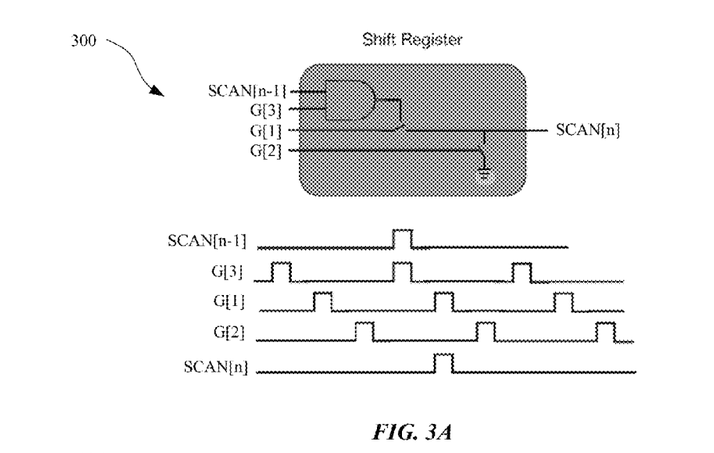
FIGS. 3A-3C illustrate different embodiments of the shift register that can be used to effectively provide for PWM of the EM signal.
Figure 3B:
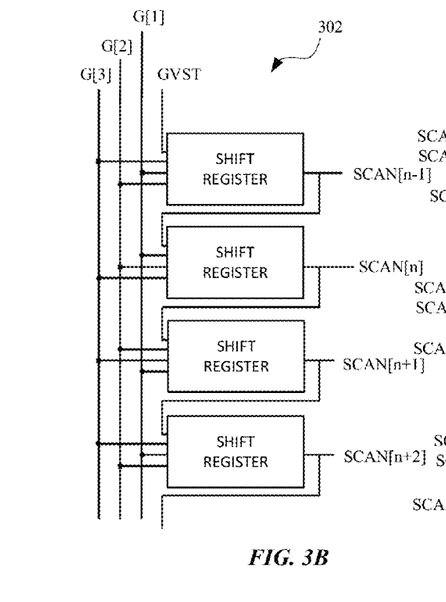

FIG. 3A-3C set forth embodiments of one or more of the shift registers discussed herein for realizing PWM of the EM signal. Specifically, diagram 300 of FIG. 3A is a logic diagram that illustrates an arrangement of the inputs that can be provided to a shift register in order to effectively provide PWM for the EM signal. For example, the shift register of diagram 300 can include inputs not limited to different clock phases G[1], G[2], and G[3] of a clock signal GVST provided by an IC driver. Each of the different clock phases G[1], G[2], and G[3] provided to the shift register are of different phases in order to prevent shorting. FIG. 3A illustrates a SCAN[n−1] signal provided from an adjacent shift register, as illustrated in FIG. 3B. The ability of shift registers to communicate between adjacent lines allows for the lines to sequentially refresh according to the signals (i.e., tokens) transmitted between lines. FIG. 3B illustrates a diagram 302 of multiple adjacent shift register connections. The SCAN[n−1] shift register receives each of the different clock phases G[1], G[2], and G[3], and the clock signal GVST. The SCAN[n−1] can thereafter be further provided to an adjacent shift register SCAN[n] connection in combination with the different clock phases G[1], G[2], and G[3]. The SCAN[n] output can thereafter be connected to a SCAN[n+1] register connection in combination with the different clock phases G[1], G[2], and G[3]. As illustrated in FIG. 3B, each of other adjacent shift register outputs, SCAN[n+1] and SCAN[n+2], are connected to adjacent shift register connections in order to realize the appropriate outputs for PWM of the EM signal.

Figure 3C:
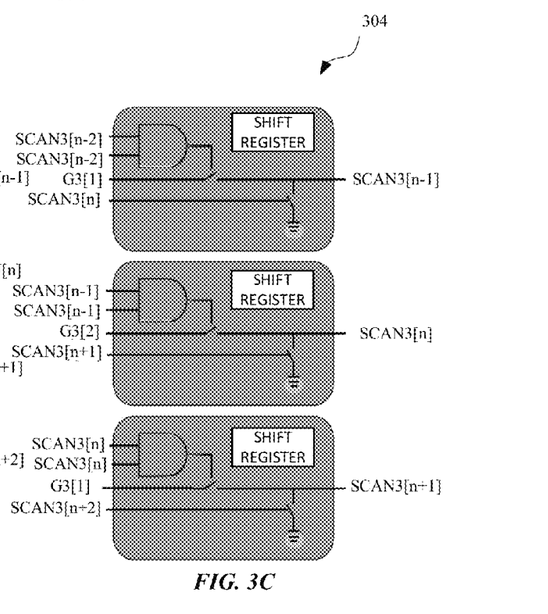

FIG. 3C illustrates a diagram 304 of shift register connections that can be used for realizing PWM of the EM signal. Specifically, diagram 304 illustrates how phases of the SCAN3 signal can be output by connections of the shift register to an inverter, as discussed herein. For example, two phases of the SCAN3 signal (SCAN3[$n$−2] and SCAN3[$n$]) and the G3[1] clock signal can be provided to the SCAN3[$n$−1] shift register connection in order to control the SCAN3[$n$−1] output to the inverter that is connected to the SCAN3[$n$−1] output, and ultimately control PWM of the EM signal provided by the inverter. Similarly, two phases of the SCAN3 signal (SCAN3[$n$−1] and SCAN3[$n$+1]) and the G3[2] clock signal can be provided to the SCAN3 [$n$] shift register connection in order to control the SCAN3[$n$] output to the inverter that is connected to the SCAN3[$n$] output, and ultimately control PWM of the EM signal provided by the inverter. Furthermore, two phases of the SCAN3 signal (SCAN3[$n$] and SCAN3[$n$+2]) and the G3[3] clock signal can be provided to the SCAN3[$n$+1] shift register connection in order to control the SCAN3[$n$+1] output to the inverter that is connected to the SCAN3[$n$+1] output, and ultimately control PWM of the EM signal provided by the inverter.

Figure 4A:
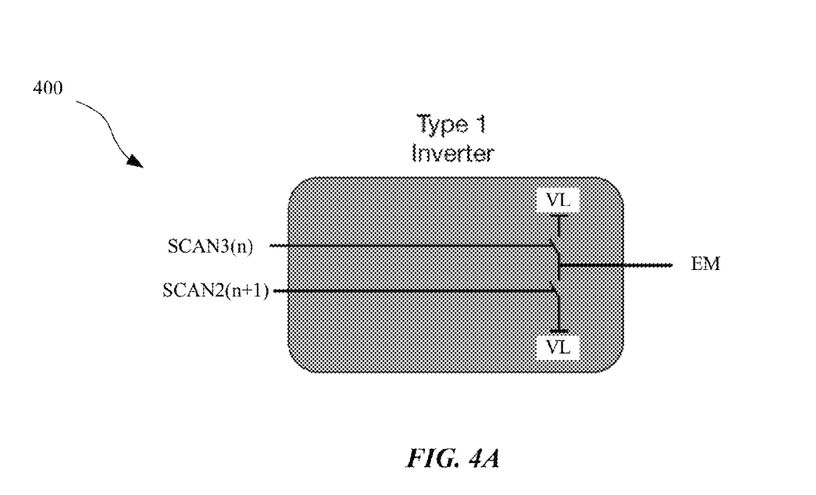
FIGS. 4A-4B illustrate different embodiments of the inverter that can be used in some embodiments discussed herein.
Figure 4B:
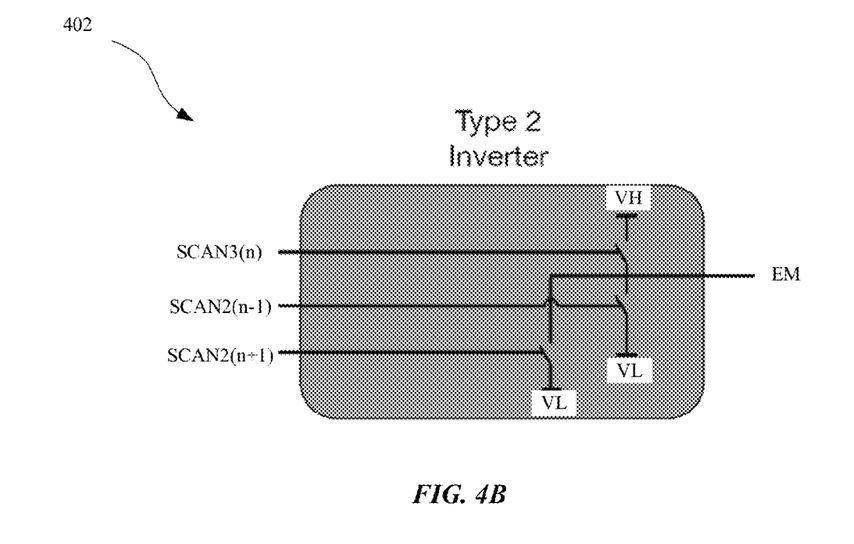

FIGS. 4A-4B illustrate different embodiments of the inverter that can be used to effectively provide for PWM of the EM signal. It should be noted that PWM of the EM signal can be performed by different inverters and shift registers according to the embodiments discussed herein, therefore the diagrams 400 and 402 should not be taken as limiting the type of shift registers and inverters that can be used. FIG. 4A illustrates a diagram 400 of an inverter that is arranged to receive a programmable output (i.e., SCAN3[$n$]) and a phase of a SCAN2 signal (i.e., SCAN2[$n$+1]). Additionally, the inverter illustrated in diagram 400 can be connected to a high voltage supply rail connection VH and a low voltage supply rail connection VL. FIG. 4B illustrates a diagram 402 of an inverter that is arranged to receive a programmable output (i.e., SCAN3[$n$]), a high voltage supply VH from a voltage supply rail of a display, a low voltage supply VL from the voltage supply rail of the display, and one or more phases of the SCAN2 signal (i.e., SCAN2[n−1] and SCAN2[n+1]). Using the aforementioned inputs, and delaying or shifting the programmable output SCAN3, each of the inverters illustrated in diagrams 400 and 402 can effectively provide PWM of the EM signal (i.e., EM).

Figure 5:
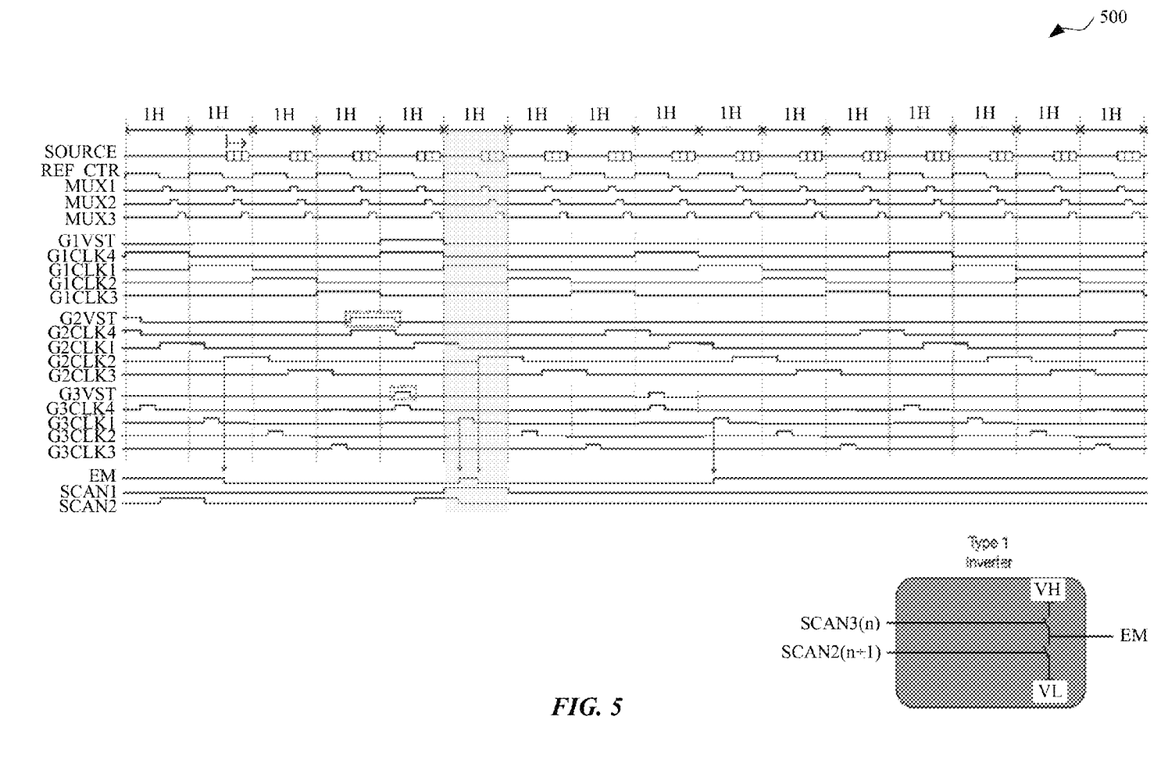
FIG. 5 illustrates a diagram that details the signals used to perform PWM of the EM signal according to the inverter illustrated in diagram.

FIG. 5 illustrates a diagram 500 of performing PWM of the EM signal according to the inverter illustrated in diagram 500. A line and each diode connected to the line can be operated according to the diagram 500. The line can include connections from a shift register such as a SCAN1 signal connection, a SCAN2 signal connection, an EM signal-off connection provided by a phase-shifted SCAN2, and an EM signal-on connection provided based on a programmable clock input.

Figure 6:
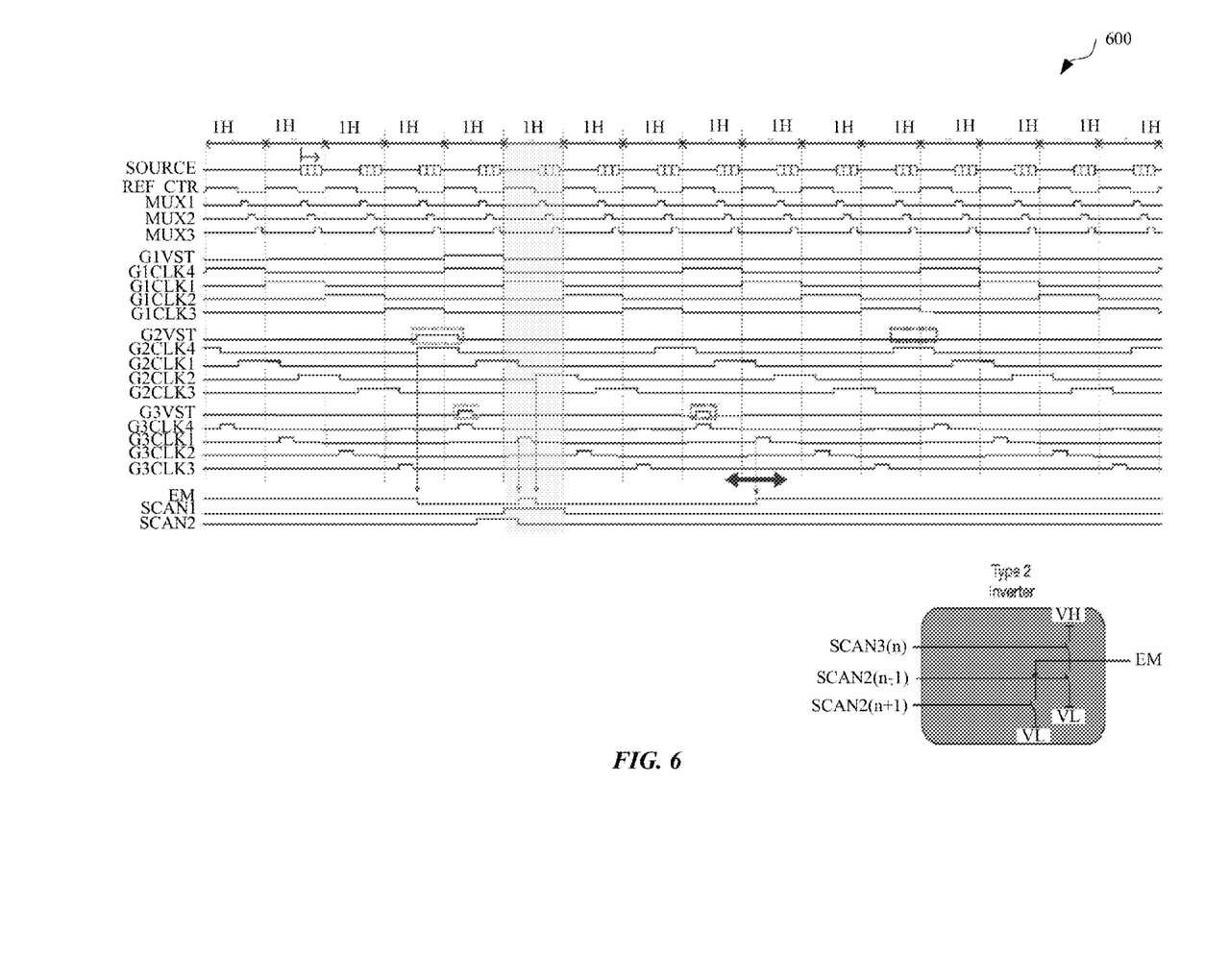
FIG. 6 illustrates a diagram that details the signals used to perform PWM of the EM signal according to the inverter illustrated in diagram.

FIG. 6 illustrates a diagram 600 of performing PWM of the EM signal according to the inverter illustrated in diagram 600. A line and each diode connected to the line can be operated according to the diagram 600. The line can include connections from a shift register such as SCAN1 and SCAN2 signal connections, an EM signal-off connection provided by two phase-shifted SCAN2 signals (i.e., "double token"), and an EM signal-on connection provided based on a programmable clock input. The term token can refer to a signal from an adjacent line that indicates or triggers an activation or deactivation of the line. The term "double token" can refer two signal sent from one or more adjacent lines.

Figure 7:
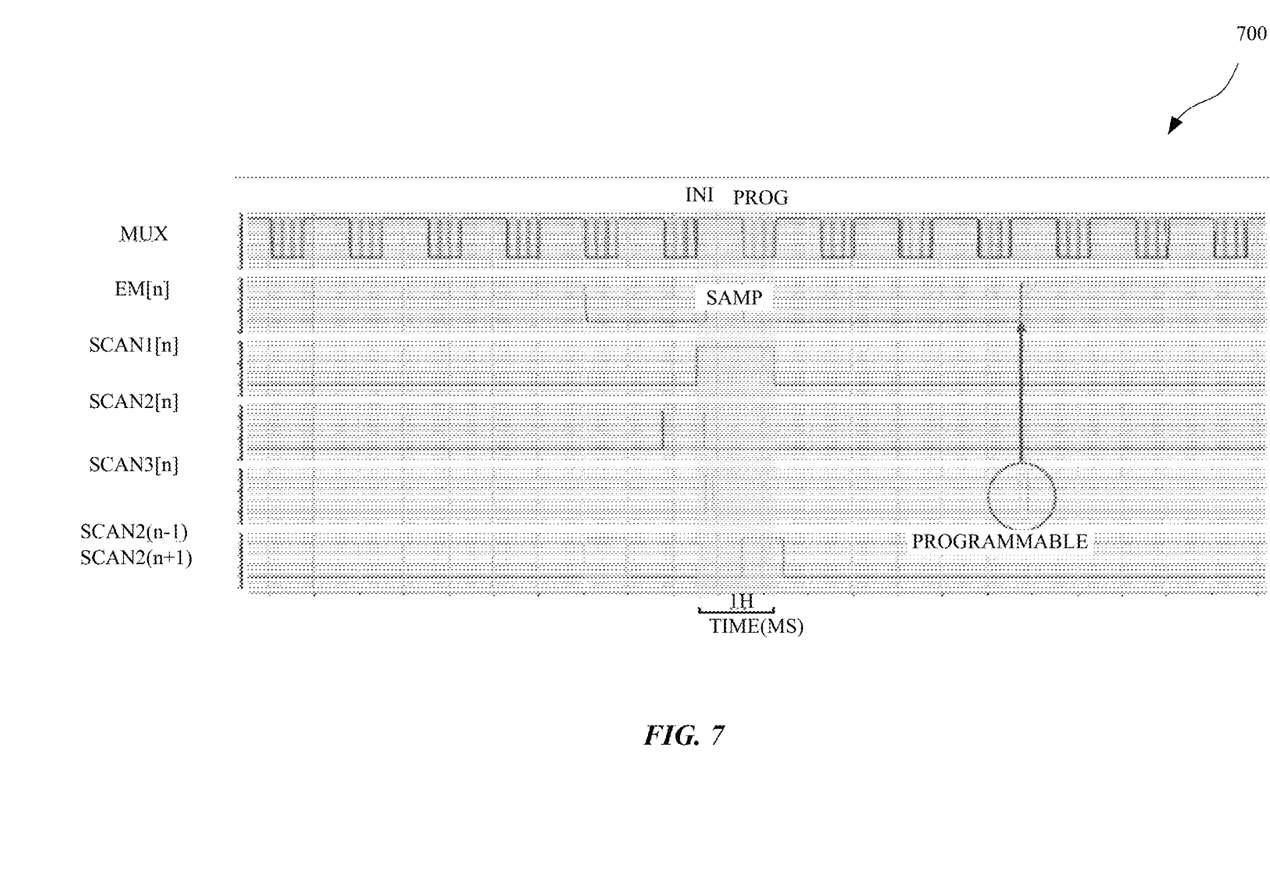
FIG. 7 illustrates a diagram of a line refresh according to one or more embodiments discussed herein.

FIG. 7 illustrates a diagram 700 of a line refresh according to one or more embodiments discussed herein. According to diagram 700, the off-time for the EM signal ("EM[n]") is controlled by the phase-shifted SCAN2 signals ("SCAN2 [n−1]" and "SCAN2[n+1]"). Additionally, the on-time for the EM signal is controlled by the "SCAN3[n]" signal pulse. Accordingly, the programmable signal "SCAN3[n]" can be used to determine the duty cycle of the EM signal. For example, the closer in time that the SCAN3[n] signal pulse is to the SCAN2[n−1] signal pulse, the longer the duty cycle for the EM signal will be during a refresh. Moreover, the further in time that the SCAN[3] signal pulse is from the SCAN[n−1] signal pulse, the shorter the duty cycle for the EM signal will be during a refresh. In this way, dimming of one or more display lines can be controlled by delaying the SCAN[3] signal pulse.

Figure 8:
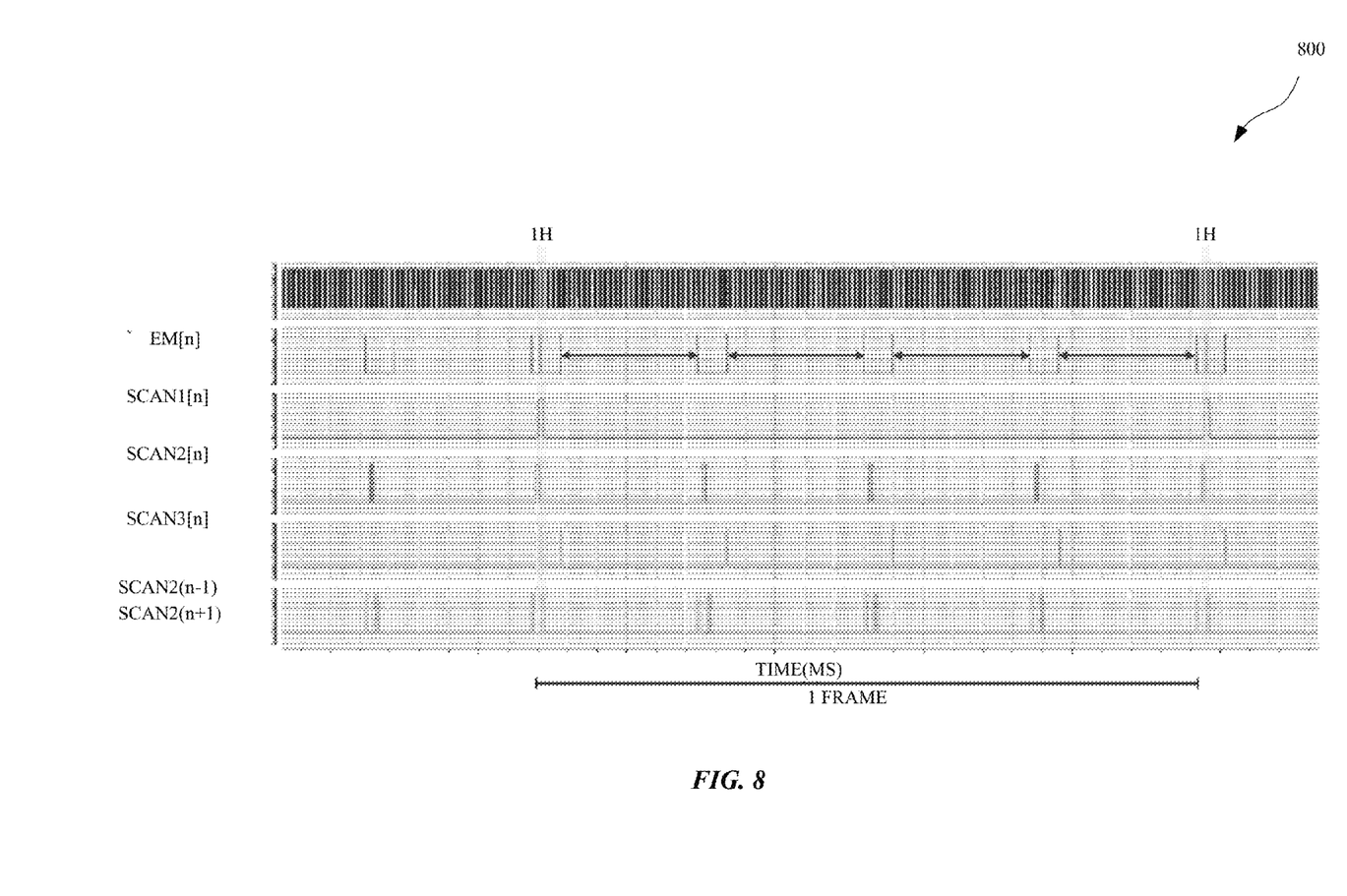
FIG. 8 illustrates a diagram of PWM of four EM signal pulses.

FIG. 8 illustrates a diagram 800 of PWM of four EM signal pulses. As illustrated, the duty cycle of each of the four EM signal pulses ("EM[n]") is determined in part on the occurrence of the SCAN3[n] pulse relative to the SCAN2 [n−1] and SCAN2[n+1] pulses. Therefore, by using the embodiments discussed herein to delay the occurrence of the SCAN3[n] pulse, the duty cycle of each of the four EM signal pulses can be effectively shortened or lengthened.

Figure 9A:
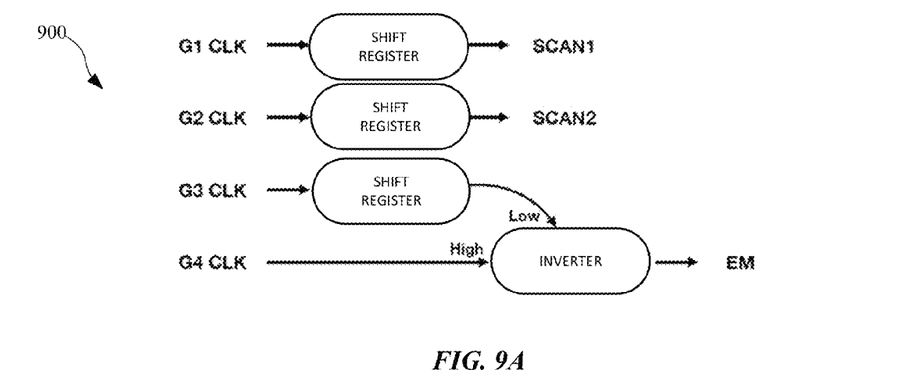
FIGS. 9A-9C illustrate alternative embodiments for operating a GIP controller and a table comparing different embodiments.

FIGS. 9A and 9B illustrate alternative embodiments for operating a GIP controller. Specifically, FIG. 9A illustrates a diagram 900 of an embodiment where a shift register provides the SCAN 1 and SCAN 2 outputs based on the G1 CLK and G2 CLK inputs, respectively. Additionally, the shift register provides an output to an inverter based on a G3 CLK input to the shift register. Using the output from the shift register (i.e., relative to the G3 CLK) and a G4 CLK input directly to the inverter, the inverter provides the EM signal. For example, when the output from the shift register is low and the G4 CLK is high, the EM signal will be on or high. Thereafter, the EM signal can be provided to a line of an LED or OLED display for turning on or off a pixel of the display.

Figure 9B:
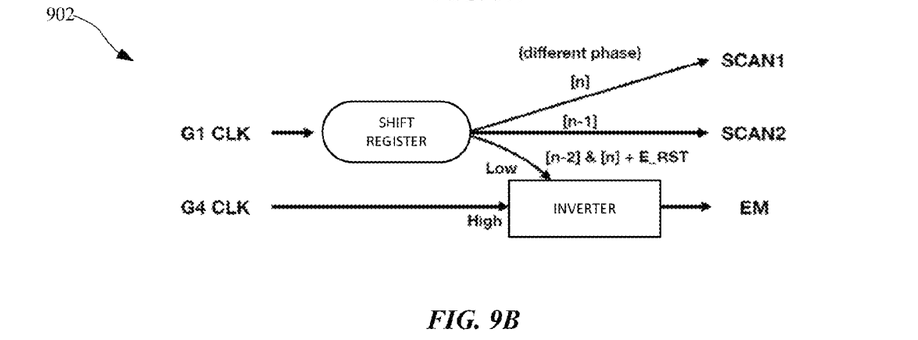

FIG. 9B illustrates a diagram 902 of an embodiment where a shift register provides SCAN1 and SCAN2 outputs based on a G1 CLK input to the shift register. The SCAN1 and SCAN2 signals can be based on a phase shifted G1 CLK signal. For example, SCAN1 can be G1 CLK[n], and SCAN2 can be G1 CLK[n−1]. The inverter of the embodiment provided in diagram 902 can directly receive another phase shifted G1 CLK signal (e.g., G1 CLK[n−1] and/or G1 CLK[n] plus a reset signal). Additionally, the inverter can be directly provided a G4 CLK signal. As a result, the inverter can provide the EM signal based on the G4 CLK signal and the phase shifted G1 CLK signal. For example, when G1 CLK[n−2] signal is low and the G4 CLK is high, the EM signal will be on or high. Thereafter, the EM signal can be provided to a line of an LED or OLED display for turning on or off a pixel of the display. However, the embodiments set forth in herein that use less clock signals per EM signal output provide for display bezel reduction and less signal routing.

Figure 9C:
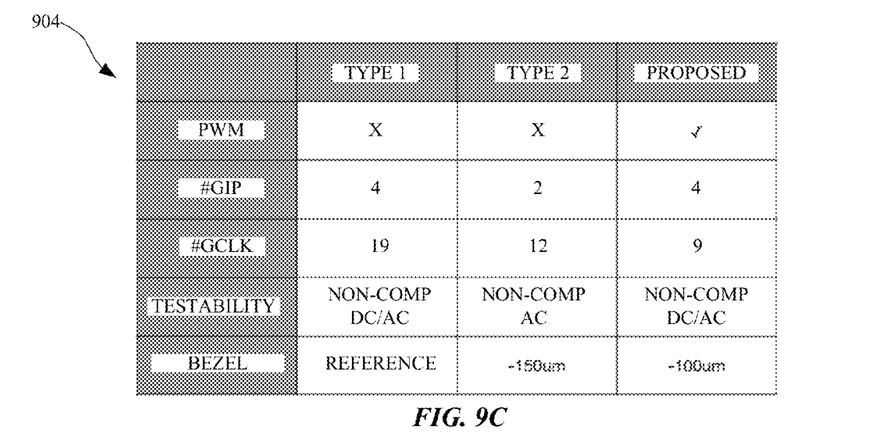

FIG. 9C illustrates a table 904 that compares a GIP implementation ("Proposed" implementation) set forth in FIG. 1 and as discussed herein, with the implementations using the Type 1 and Type 2 inverters illustrated in FIGS. 9A and 9B respectively. Specifically, table 904 illustrates that the Proposed implementation allows for PWM of the EM signal, whereas the Type 1 and Type 2 implementations do not provide for PWM of the EM signal. Furthermore, the number of GIPs for the Proposed implementation is 4, whereas the number of GIPs for the Type 1 and Type 2 implementations is 4 and 2 respectively. Additionally, the number of clocks to realize the Proposed implementation of FIG. 1 can be 9 clock signals, whereas the number of clock signals to realize the Type 1 and Type 2 implementations can be 19 and 12 clock signals respectively. This provides the advantage of reduced signal routing area for the Proposed implementation compared to the Type 1 and Type 2 implementations. Additionally, bezel reduction can be reduced by approximately 100 micrometers in the Proposed implementation and approximately 150 micrometers for the Type 2 implementation.

Figure 10:
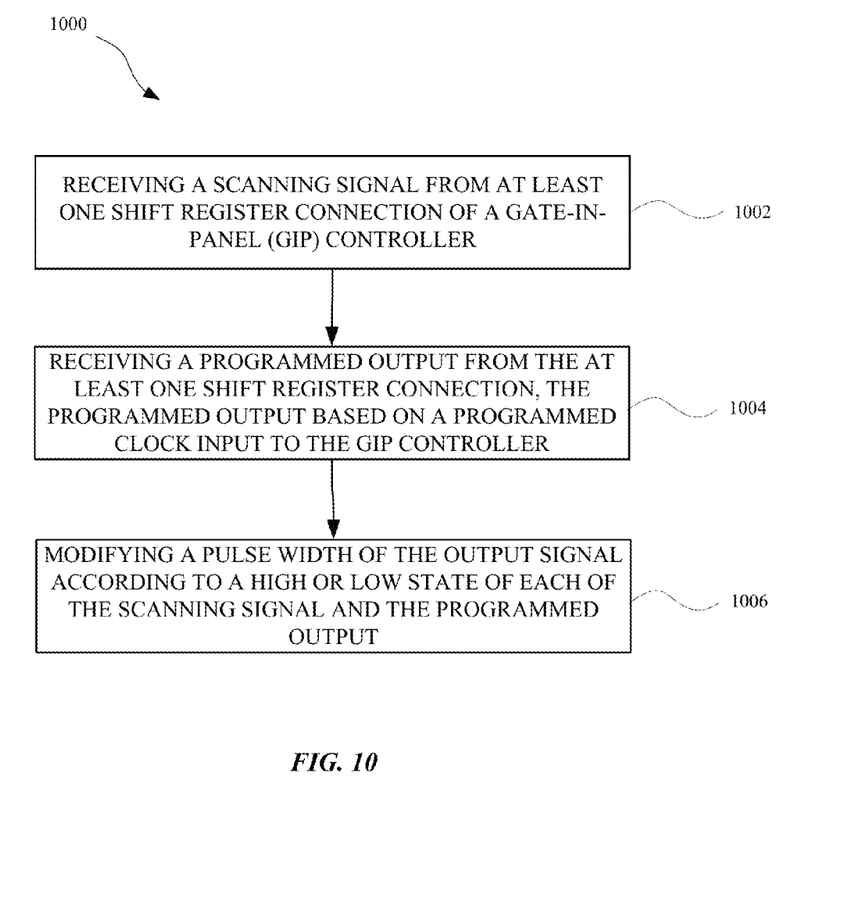
FIG. 10 illustrates a method for performing PWM of an EM signal for a line of a computer display, such as an LED or OLED display.

FIG. 10 illustrates a method 1000 for performing PWM of an EM signal for a line of a computer display, such as an LED or OLED display. The method 1000 can be performed by an inverter of a GIP controller, a GIP controller, processor, or any other suitable device or apparatus that is suitable for controlling an input to a line of a computer display. The method 1000 can include a step 1002 of receiving a scanning signal from at least one shift register of a GIP controller. The scanning signal can be one or more original or phase-shifted clock signals received by the GIP controller. By increasing the number of phases used to perform PWM of the EM signal, resolution of the resulting PWM can be increased. The method 1000 further includes a step 1004 of receiving a programmed output from the at least one shift register. The programmed output can be based on a programmed clock input to the GIP controller. For example, in some embodiments, the GIP controller receives a single clock signal from an IC driver, and the programmed clock input is the single clock input delayed or shifted according to the programming of the GIP controller, an IC driver coupled to the GIP controller, or any other suitable system connected to the computer display. The method 1000 can also include a step 1006 of modifying a pulse width of the output signal according to a high or low state of each of the scanning signal and the programmed output. A high or low state can refer to the presence and absence of a pulse, respectively. By modifying the pulse width of the output signal, certain features such as dimming can be exhibited by the computer display.

Figure 11:
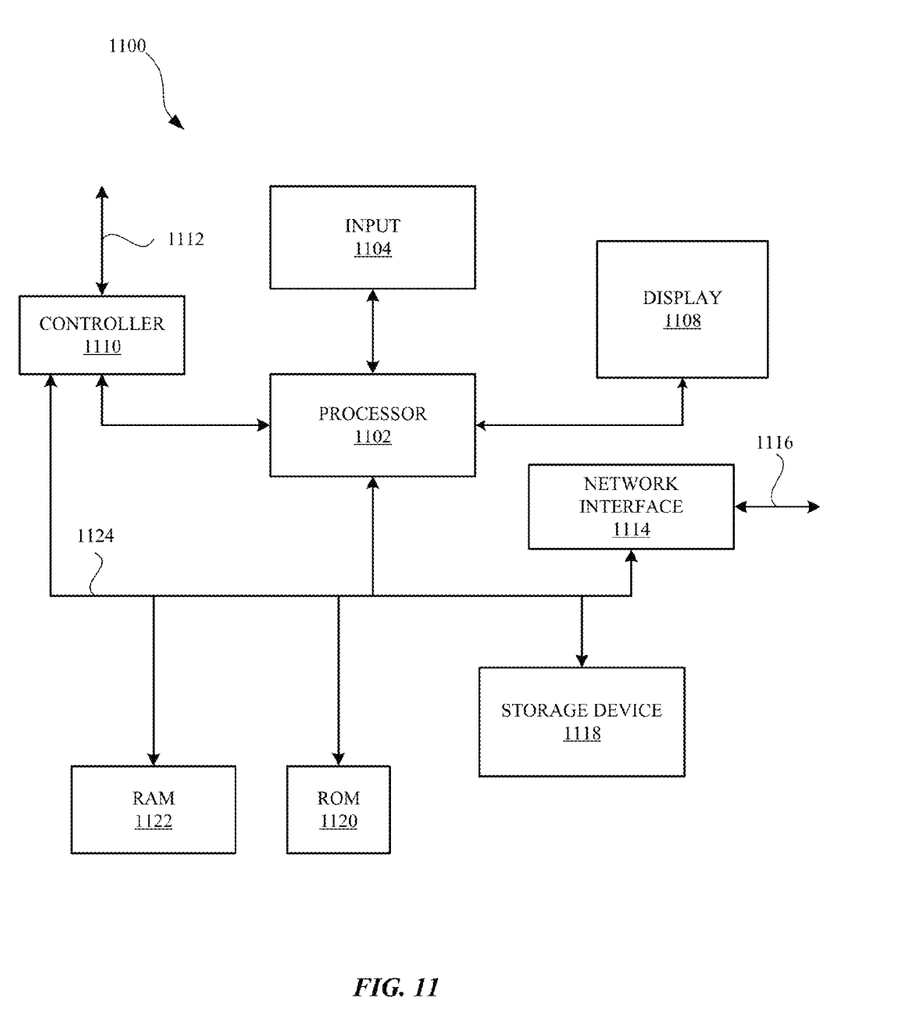
FIG. 11 is a block diagram of a computing device that can represent the components of an integrated circuit (IC) driver, GIP system, display, and/or any other suitable device or component that can provide the embodiments discussed herein.

FIG. 11 is a block diagram of a computing device 1100 that can represent the components of the IC driver, GIP system 100, display, and/or any other suitable device or component that can provide the embodiments discussed herein. It will be appreciated that the components, devices or elements illustrated in and described with respect to FIG. 11 may not be mandatory and thus some may be omitted in certain embodiments. The computing device 1100 can include a processor 1102 that represents a microprocessor, a coprocessor, circuitry and/or a controller for controlling the overall operation of computing device 1100. Although illustrated as a single processor, it can be appreciated that the processor 1102 can include a plurality of processors. The plurality of processors can be in operative communication with each other and can be collectively configured to perform one or more functionalities of the computing device 1100 as described herein. In some embodiments, the processor 1102 can be configured to execute instructions that can be stored at the computing device 1100 and/or that can be otherwise accessible to the processor 1102. As such, whether configured by hardware or by a combination of hardware and software, the processor 1102 can be capable of performing operations and actions in accordance with embodiments described herein.

The computing device 1100 can also include user input device 1104 that allows a user of the computing device 1100 to interact with the computing device 1100. For example, user input device 1104 can take a variety of forms, such as a button, keypad, dial, touch screen, audio input interface, visual/image capture input interface, input in the form of sensor data, etc. Still further, the computing device 1100 can include a display 1008 (screen display) that can be controlled by processor 1102 to display information to a user. Controller 1110 can be used to interface with and control different equipment through equipment control bus 1112. The computing device 1100 can also include a network/bus interface 1114 that couples to data link 1116. Data link 1116 can allow the computing device 1100 to couple to a host computer or to accessory devices. The data link 1116 can be provided over a wired connection or a wireless connection. In the case of a wireless connection, network/bus interface 1114 can include a wireless transceiver.

The computing device 1100 can also include a storage device 1118, which can have a single disk or a plurality of disks (e.g., hard drives) and a storage management module that manages one or more partitions (also referred to herein as "logical volumes") within the storage device 1118. In some embodiments, the storage device 1118 can include flash memory, semiconductor (solid state) memory or the like. Still further, the computing device 1100 can include Read-Only Memory (ROM) 1120 and Random Access Memory (RAM) 1122. The ROM 1120 can store programs, code, instructions, utilities or processes to be executed in a non-volatile manner. The RAM 1122 can provide volatile data storage, and store instructions related to components of the storage management module that are configured to carry out the various techniques described herein. The computing device 1100 can further include data bus 1124. Data bus 1124 can facilitate data and signal transfer between at least processor 1102, controller 1110, network interface 1114, storage device 1118, ROM 1120, and RAM 1122.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable storage medium. The computer readable storage medium can be any data storage device that can store data which can thereafter be read by a computer system. Examples of the computer readable storage medium include read-only memory, random-access memory, CD-ROMs, HDDs, DVDs, magnetic tape, and optical data storage devices. The computer readable storage medium can also be distributed over network-coupled computer systems so that the computer readable code is stored and executed in a distributed fashion. In some embodiments, the computer readable storage medium can be non-transitory.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. A computer-implemented method for using a programmable clock input to a gate-in-panel (GIP) controller to perform pulse-width modulation (PWM) of an output signal provided to a line of a display by an inverter of the GIP controller, the method comprising:
   by the inverter of the GIP controller:
   receiving a scanning signal from at least one shift register of the GIP controller;
   receiving a programmed output from the at least one shift register, wherein the programmed output is based on the programmable clock input to the GIP controller; and
   causing a pulse-width of the output signal to be adjusted according to a high or low state of each of the scanning signal and the programmed output.

2. The computer-implemented method of claim 1, wherein the scanning signal is a phase-shifted scanning signal provided by the at least one shift register.

3. The computer-implemented method of claim 1, wherein the programmable clock input is provided to the GIP controller from an integrated circuit (IC) driver of the display.

4. The computer-implemented method of claim 1, wherein the at least one shift register is configured to receive an output corresponding to an adjacent GIP controller connected to an adjacent line in the display.

5. The computer-implemented method of claim 1, wherein the programmable clock input provides for dimming control of the line of the display.

6. The computer-implemented method of claim 1, wherein an amount by which the line of the display is dimmed depends on timing of the programmable clock input.

7. The computer-implemented method of claim 1, wherein the inverter receives multiple phase-shifted scanning signals provided by the at least one shift register.

8. The computer-implemented method of claim 1, wherein the at least one shift register operates according a two-phase clock input, a three-phase clock input, or a four-phase clock input.

9. A system, comprising:
   a gate-in-panel (GIP) controller;

an integrated circuit (IC) driver configured to provide a programmable clock input to the GIP controller; and at least one display line connected to the GIP controller, wherein the GIP controller comprises:
  i) at least one shift register configured to provide at least one scanning signal to the at least one display line; and
  ii) an inverter connected to the at least one shift register, wherein the inverter is configured to output a pulse-width modulated (PWM) emission signal based on the programmable clock input provided to the at least one shift register and the at least one scanning signal.

10. The system of claim 9, wherein the programmable clock input provides for dimming control of the at least one display line.

11. The system of claim 10, wherein an amount by which the at least one display line is dimmed depends on timing of the programmable clock input.

12. The system of claim 9, wherein the at least one shift register is configured to receive an output corresponding to an adjacent GIP controller connected to an adjacent line in a display relative to the at least one display line.

13. The system of claim 9, wherein the at least one scanning signal is a phase-shifted scanning signal provided by the at least one shift register.

14. The system of claim 9, wherein the inverter receives multiple phase-shifted scanning signals provided by the at least one shift register.

15. The system of claim 9, wherein the at least one shift register operates according a two-phase clock input, a three-phase clock input, or a four-phase clock input.

16. A gate-in-panel (GIP) controller, comprising:
  a shift register configured to provide multiple scanning signals and a programmable clock output based on at least one clock input from an integrated circuit (IC) driver, and
  an inverter connected to a scanning signal of the multiple scanning signals and the programmable clock output of the shift register, wherein the inverter is configured to provide a pulse-width modulated (PWM) emission signal to a line of a display based on a timing of the programmable clock output and the scanning signal.

17. The GIP controller of claim 16, wherein the multiple scanning signals are phase-shifted scanning signals.

18. The GIP controller of claim 16, wherein the shift register is configured to operate according a two-phase clock input.

19. The GIP controller of claim 16, wherein the shift register is configured to operate according a three-phase clock input or a four-phase clock input.

20. The GIP controller of claim 16, wherein the programmable clock output provides for dimming control of the line of the display.

* * * * *